(12) United States Patent
Kushida (10) Patent No.: US 8,283,712 B2
(45) Date of Patent: Oct. 9, 2012

(54) SEMICONDUCTOR MEMORY DEVICE AND MANUFACTURING METHOD FOR SEMICONDUCTOR MEMORY DEVICE

(75) Inventor: Keiichi Kushida, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 366 days.

(21) Appl. No.: 12/557,169

(22) Filed: Sep. 10, 2009

(65) Prior Publication Data

US 2010/0109061 A1 May 6, 2010

(30) Foreign Application Priority Data

Nov. 4, 2008 (JP) ................................ 2008-283276

(51) Int. Cl.
*H01L 43/06* (2006.01)
*H01L 43/12* (2006.01)

(52) U.S. Cl. . 257/295; 257/296; 257/300; 257/E43.003; 257/E43.006

(58) Field of Classification Search .................. 257/295, 257/296, 300
See application file for complete search history.

(56) References Cited

U.S. PATENT DOCUMENTS

| 6,649,953 | B2 * | 11/2003 | Cha | 257/295 |
| 7,366,010 | B2 * | 4/2008 | Hosobuchi | 365/158 |
| 2003/0128580 | A1 | 7/2003 | Park et al. | |
| 2005/0002267 | A1 * | 1/2005 | Daughton et al. | 365/232 |
| 2008/0315300 | A1 * | 12/2008 | Higashino | 257/329 |

FOREIGN PATENT DOCUMENTS

| JP | 2001-332081 | 11/2001 |
| JP | 2003-218328 | 7/2003 |
| JP | 2007-019559 | 1/2007 |

OTHER PUBLICATIONS

Explanation of Non-English References in 2 pages.
Machine Translation of Japanese Publication No. JP 2001-332081, Foreign reference cited in our Sep. 10, 2009 IDS.
Machine Translation of Japanese Publication No. JP 2003-218328, (which Claims Priority to Korean Application No. 2002-00988), Foreign reference cited in our Sep. 10, 2009 IDS.
Machine Translation of Japanese Publication No. JP 2007-019559, Foreign reference cited in our Sep. 10, 2009 IDS.

* cited by examiner

*Primary Examiner* — Jerome Jackson, Jr.
*Assistant Examiner* — David Spalla
(74) *Attorney, Agent, or Firm* — Knobbe, Martens, Olson & Bear LLP (57) ABSTRACT

A channel layer is deposited on a first impurity layer, a second impurity layer is deposited on the channel layer, a gate electrode is placed to surround a circumference of the channel layer with a gate insulating film interposed therebetween, a spin-injection magnetization-reversal element is deposited on the second impurity layer, a bit line is placed on the spin-injection magnetization-reversal element, and a word line is placed on the bit line to be electrically connected to the gate electrode.

10 Claims, 8 Drawing Sheets

SEMICONDUCTOR MEMORY DEVICE AND MANUFACTURING METHOD FOR SEMICONDUCTOR MEMORY DEVICE

CROSS-REFERENCE TO RELATED APPLICATIONS

This application is based upon and claims the benefit of priority from the prior Japanese Patent Application No. 2008-283276, filed on Nov. 4, 2008; the entire contents of which are incorporated herein by reference.

BACKGROUND OF THE INVENTION

1. Field of the Invention

The present invention relates to a semiconductor memory device and a manufacturing method for a semiconductor memory device, and, more particularly to a semiconductor memory device and a manufacturing method for a semiconductor memory device preferably applied to a magnetic random access memory (MRAM) in which a magnetoresistive element that magnetically stores information therein is deposited on a selection transistor.

2. Description of the Related Art

The MRAM is attracting attention as a semiconductor memory device having high-speed accessibility similar to that of a static RAM (SRAM), a high degree of integration similar to that of a dynamic RAM (DRAM), and nonvolatility similar to that of a flash memory.

The MRAM includes magnetoresistive elements that magnetically store therein information, and a selection transistor that selects a magnetoresistive element of a unit cell for which reading or writing is performed. A gate electrode of the selection transistor is placed on a semiconductor substrate, and a source and a drain thereof are formed on the semiconductor substrate on both sides of the gate electrode. The magnetoresistive element is placed on a multilayer interconnection layer formed on the selection transistor.

A conventional technique discloses a method of forming a magnetic memory element that has a data storing function utilizing a magnetic body on a vertical transistor, and arranging a bit line connected to the vertical transistor via the magnetic memory element and a writing word line crossing over the bit line, to increase the degree of integration in the MRAM (see Japanese Patent Application Laid-open No. 2003-218328, for example).

However, in the method disclosed in Japanese Patent Application Laid-open No. 2003-218328, because both sides of an impurity deposition are coated with a gate deposition, a shielding effectiveness of flux generated by a current that passes through the impurity deposition is not sufficiently high. Accordingly, when the degree of integration in the MRAM is increased, magnetic interference between memory cells becomes larger and the risk of malfunctions becomes higher.

Further, in the method disclosed in Japanese Patent Application Laid-open No. 2003-218328, the writing word line needs to be arranged over the bit line separately from a word line as the gate deposition. Therefore, the number of interconnections is increased, which hinders an increase in the degree of integration in the MRAM.

BRIEF SUMMARY OF THE INVENTION

A semiconductor memory device according to an embodiment of the present invention comprises: a channel layer deposited on a first impurity layer; a second impurity layer deposited on the channel layer; a gate electrode placed to surround a circumference of the channel layer with a gate insulating film interposed therebetween; a spin-injection magnetization-reversal element deposited on the second impurity layer; a bit line placed on the spin-injection magnetization-reversal element; and a word line placed on the bit line to be electrically connected to the gate electrode.

A manufacturing method for a semiconductor memory device according to an embodiment of the present invention comprises: forming a selection transistor on a semiconductor substrate, the selection transistor including a first impurity layer, a channel layer, and a second impurity layer successively deposited, and a gate electrode placed to surround a circumference of the channel layer with a gate insulating film interposed therebetween; forming a first insulting layer on the semiconductor substrate to embed circumferences of the first impurity layer, the channel layer, the second impurity layer, and the gate electrode in the first insulating layer; forming a spin-injection magnetization-reversal element deposited on the second impurity layer having a circumference thereof embedded in the first insulating layer; forming a second insulating layer on the first insulating layer to embed a circumference of the spin-injection magnetization-reversal element in the second insulating layer; forming a bit line on the spin-injection magnetization-reversal element; forming a third insulating layer on the second insulating layer to embed the bit line in the third insulating layer; and forming a word line on the third insulating layer to be electrically connected to the gate electrode via a plug electrode embedded in the first to third insulating layers.

A manufacturing method for a semiconductor memory device according to an embodiment of the present invention comprises: successively depositing a first impurity layer, a channel layer, and a second impurity layer by epitaxial growth; successively depositing a first magnetic layer, a nonmagnetic layer, and a second magnetic layer on the second impurity layer by sputtering; patterning the first impurity layer, the channel layer, the second impurity layer, the first magnetic layer, the nonmagnetic layer, and the second magnetic layer in a form of a pillar; forming a gate insulating film on side walls of the first impurity layer, the channel layer, the second impurity layer, the first magnetic layer, the nonmagnetic layer, and the second magnetic layer patterned in the form of a pillar; forming a gate electrode on the gate insulating film to surround circumferences of the first impurity layer, the channel layer, the second impurity layer, the first magnetic layer, the nonmagnetic layer, and the second magnetic layer; forming a bit line on the second magnetic layer; forming an insulating layer to embed the first impurity layer, the channel layer, the second impurity layer, the first magnetic layer, the nonmagnetic layer, the second magnetic layer, and the bit line in the insulating layer; embedding a plug electrode connected to the gate electrode in the insulating layer; and forming a word line connected to the plug electrode on the insulating layer.

DETAILED DESCRIPTION OF THE INVENTION

Exemplary embodiments of a semiconductor memory device according to the present invention will be explained below in detail with reference to the accompanying drawings. The present invention is not limited to the embodiments.

Figure 1A:
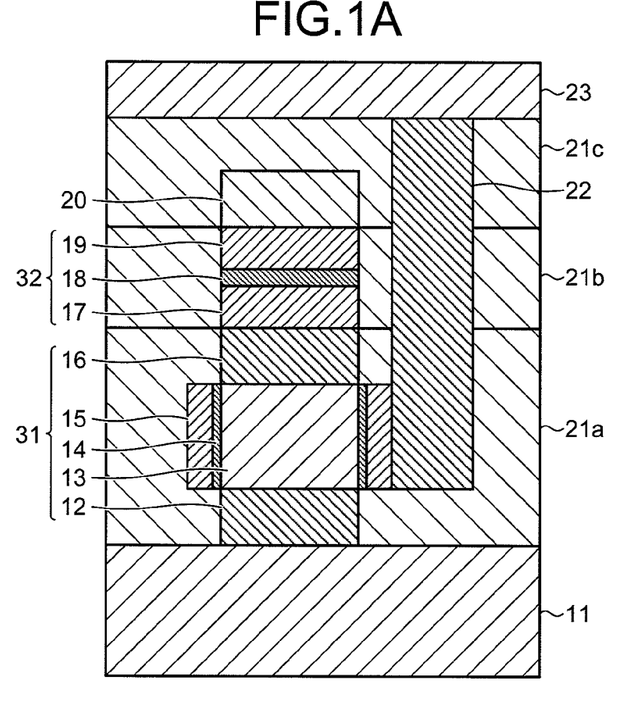
FIG. 1A is a cross-sectional view of a schematic configuration of a unit cell in a semiconductor memory device according to a first embodiment of the present invention.
Figure 1B:
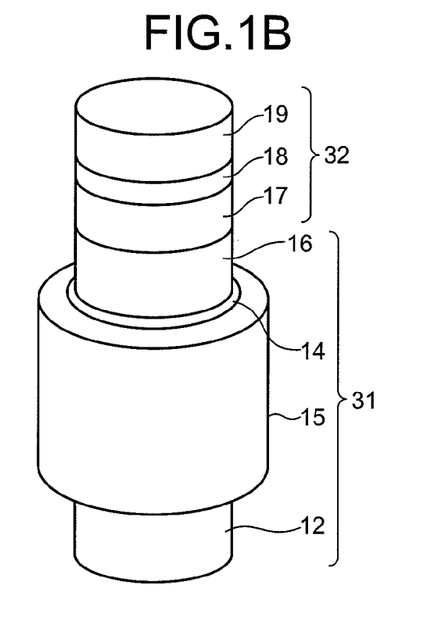
FIG. 1B is a perspective view of a deposition structure including a selection transistor and a spin-injection magnetization-reversal element shown in FIG. 1A.
Figure 2:
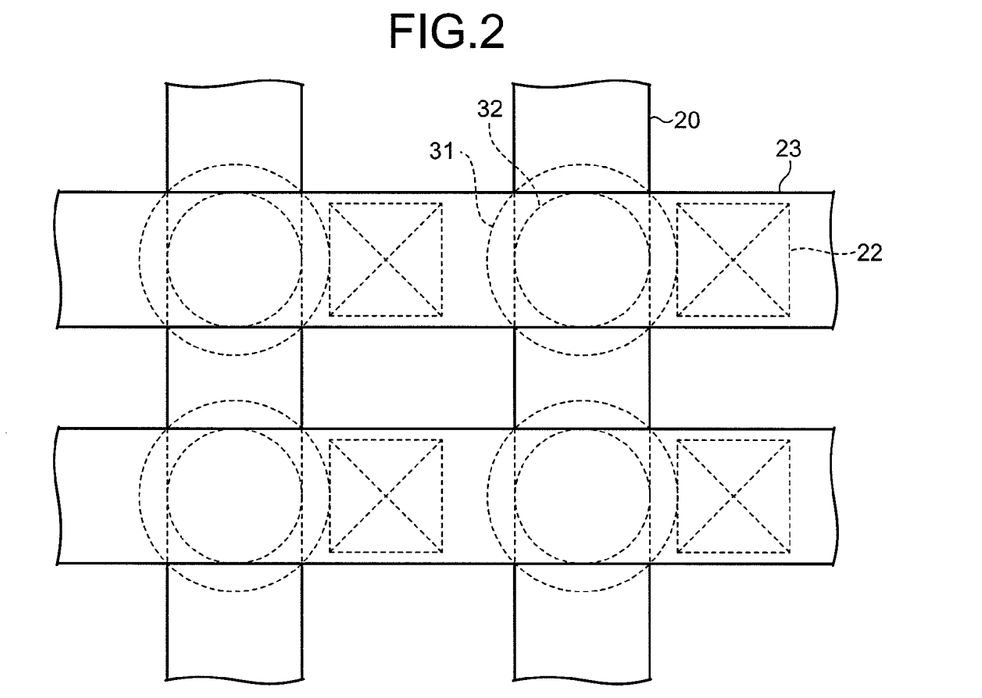
FIG. 2 is a plan view of a schematic configuration of the semiconductor memory device according to the first embodiment.

FIG. 1A is a cross-sectional view of a schematic configuration of a unit cell in a semiconductor memory device according to a first embodiment of the present invention. FIG. 1B is a perspective view of a deposition structure of a selection transistor 31 and a spin-injection magnetization-reversal element 32 shown in FIG. 1A. FIG. 2 is a plan view of a schematic configuration of the semiconductor memory device according to the first embodiment.

As shown in FIGS. 1A, 1B, and FIG. 2, an impurity layer 12, a channel layer 13, and an impurity layer 16 are successively deposited on a semiconductor substrate 11 in the form of a pillar. The impurity layers 12 and 16 can be made of semiconductors highly doped with impurities, and can constitute a source and a drain of a transistor. The channel layer 13 can form a p-n junction between the impurity layers 12 and 16, respectively. Semiconductors forming the semiconductor substrate 11, the impurity layers 12 and 16, and the channel layer 13 can be selected from among Si, Ge, SiGe, SiC, SiSn, PbS, GaAs, InP, GaP, GaN, ZnSe, GaInAsP, and the like.

A gate electrode 15 is then placed to surround the circumference of the channel layer 13 with a gate insulating film 14 interposed therebetween, thereby forming the selection transistor 31. An insulating layer 21a is embedded around the selection transistor 31.

The spin-injection magnetization-reversal element 32 is formed on the impurity layer 16. An insulating film 21b is embedded around the spin-injection magnetization-reversal element 32. The external form of the spin-injection magnetization-reversal element 32 can be adapted to the external forms of the impurity layer 12, the channel layer 13, and the impurity layer 16. For example, the spin-injection magnetization-reversal element 32, the impurity layer 12, the channel layer 13, and the impurity layer 16 can be column-shaped.

The spin-injection magnetization-reversal element 32 can apply a deposition structure of a magnetic layer 17, a nonmagnetic layer 18, and a magnetic layer 19, for example. The direction of magnetization of the magnetic layer 17 can be brought parallel or antiparallel to that of the magnetic layer 19 by using the magnetic layer 17 as a magnetization free layer, using the magnetic layer 19 as a magnetization fixed layer, and changing the direction of a current vertically flowing through the deposition structure of the magnetic layer 17, the nonmagnetic layer 18, and the magnetic layer 19.

Resistance of the spin-injection magnetization-reversal element 32 changes according to whether the direction of the magnetization of the magnetic layer 17 is parallel or antiparallel to that of the magnetic layer 19. Accordingly, information can be stored in the spin-injection magnetization-reversal element 32 by controlling the direction of the magnetization of the magnetic layer 17. Further, the information stored in the spin-injection magnetization-reversal element 32 can be read out by detecting changes in the resistance of the spin-injection magnetization-reversal element 32.

The spin-injection magnetization-reversal element 32 uses spin of electrons to control the magnetization direction of the magnetic layer 17, and a write current becomes smaller when the size of the spin-injection magnetization-reversal element 32 is reduced. Therefore, a higher degree of integration can be provided while suppressing an increase in current consumption. The spin-injection magnetization-reversal element 32 does not need an external magnetic field to control the magnetization direction of the magnetic layer 17. Accordingly, there is no need to arrange a writing word line, which leads to a higher degree of integration.

When a conductive film is used as the nonmagnetic layer 18, the spin-injection magnetization-reversal element 32 can be operated as a giant magnetoresistive (GMR) element. When a tunnel film is used as the nonmagnetic layer 18, the spin-injection magnetization-reversal element 32 can be operated as a tunnel magnetoresistive (TMR) element.

Ferromagnetic materials including Co, Fe, or Ni, such as CoFe, NiFe, or CoFeB, and alloys thereof can be used as materials for the magnetic layers 17 and 19. When the spin-injection magnetization-reversal element 32 is operated as the GMR element, a metal such as Ru, Cu, Al, or Au can be used as a material for the nonmagnetic layer 18. When the spin-injection magnetization-reversal element 32 is operated as the TMR element, an insulating film such as AlO, HfO, TiO, or TaO can be used as the material for the nonmagnetic layer 18.

A bit line 20 electrically connected to the magnetic layer 19 is formed in a column direction on the insulating layer 21b. The bit line 20 is embedded in an insulating layer 21c.

A word line 23 is formed in a row direction on the insulating layer 21c. The word line 23 is electrically connected to the gate electrode 15 via a plug electrode 22 embedded in the insulating layers 21a to 21c. It is preferable that the diameter of the gate electrode 15 be set larger than the width of the bit line 20. When highly doped with impurities, the semiconductor substrate 11 can be used as a plate line.

Figure 3:
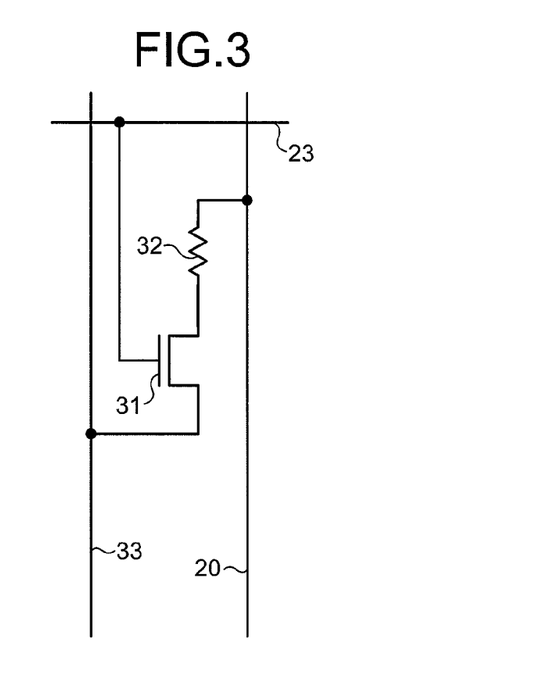
FIG. 3 depicts an equivalent circuit to the unit cell of the semiconductor memory device shown in FIG. 1A.

FIG. 3 depicts an equivalent circuit to the unit cell of the semiconductor memory device shown in FIG. 1A.

In FIG. 3, the drain of the selection transistor 31 is connected to the bit line 20 via the spin-injection magnetization-reversal element 32 working as a magnetoresistive element. The source of the selection transistor 31 is connected to a plate line 33. The gate of the selection transistor 31 is connected to the word line 23.

When writing into the spin-injection magnetization-reversal element 32 in FIG. 1A is to be performed, the selection transistor 31 is turned on through the word line 23 to flow a current vertically in the spin-injection magnetization-reversal element 32. When the current flows from the magnetic layer 17 working as the magnetization free layer to the magnetic layer 19 working as the magnetization fixed layer, electrons having up spin are injected from the magnetic layer 19 to the magnetic layer 17. As a result, upward torque is applied to the electrons in the magnetic layer 17, and the direction of magnetization of the magnetic layer 17 is brought parallel to that of the magnetic layer 19. Accordingly, a logical value "0" is stored in the spin-injection magnetization-reversal element 32.

Meanwhile, when the current flows from the magnetic layer 19 as the magnetization fixed layer to the magnetic layer 17 as the magnetization free layer, electrons having up spin are injected from the magnetic layer 17 to the magnetic layer 19, and electrons having down spin are reflected on an interface between the magnetic layer 19 and the nonmagnetic layer 18 and returned to the magnetic layer 17. As a result, downward torque is applied to the electrons in the magnetic layer 17, and the magnetization direction of the magnetic layer 17 is brought antiparallel to that of the magnetic layer 19. Accordingly, a logical value "1" is stored in the spin-injection magnetization-reversal element 32.

When reading from the spin-injection magnetization-reversal element 32 is to be performed, the selection transistor 31 is turned on through the word line 23, and a current is vertically flown in the spin-injection magnetization-reversal element 32 to an extent that the magnetization of the magnetic layer 17 is not reversed. A potential difference in the spin-injection magnetization-reversal element 32 obtained when the current is vertically flown in the spin-injection magnetization-reversal element 32 is detected, and the potential difference and a reference value are then compared. In this way, the information stored in the spin-injection magnetization-reversal element 32 is read out.

Because the spin-injection magnetization-reversal element 32 is deposited on the selection transistor 31, it is unnecessary to secure a space for arranging the spin-injection magnetization-reversal element 32 on the semiconductor substrate 11. In addition, the selection transistor 31 and the spin-injection magnetization-reversal element 32 can be downsized without increasing the write current. Therefore, a higher degree of integration in the MRAM can be achieved.

Because the gate electrode 15 is placed to surround the circumference of the channel layer 13, the shielding effectiveness of the flux generated by the current flowing through the channel layer 13 can be increased. Accordingly, it is possible to reduce the distance between memory cells while suppressing magnetic interference between the memory cells. Therefore, the degree of integration in the MRAM can be increased without causing a malfunction.

FIGS. 4A to 4E are cross-sectional views for explaining a manufacturing method for the semiconductor memory device shown in FIG. 1A.

Figure 4A:
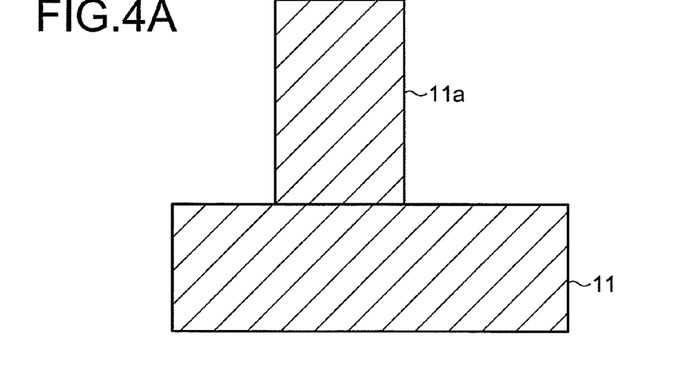
FIGS. 4A to 4E are cross-sectional views for explaining a manufacturing method for the semiconductor memory device shown in FIG. 1A.

In FIG. 4A, the semiconductor substrate 11 is dry etched by using a resist pattern formed by a photolithographic technique as a mask, thereby forming a pillar 11a on the semiconductor substrate 11.

Figure 4B:
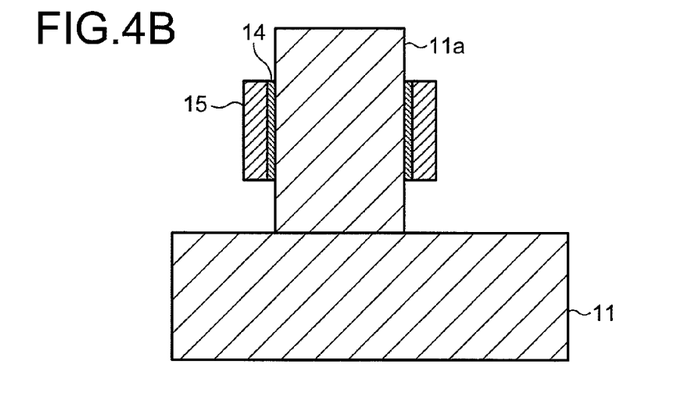

The gate insulating film 14 is then formed on a surface of the pillar 11a by using a method such as thermal oxidation, as shown in FIG. 4B. The gate electrode 15 is formed on the gate insulating film 14 to surround a central circumference of the pillar 11a.

Figure 4C:
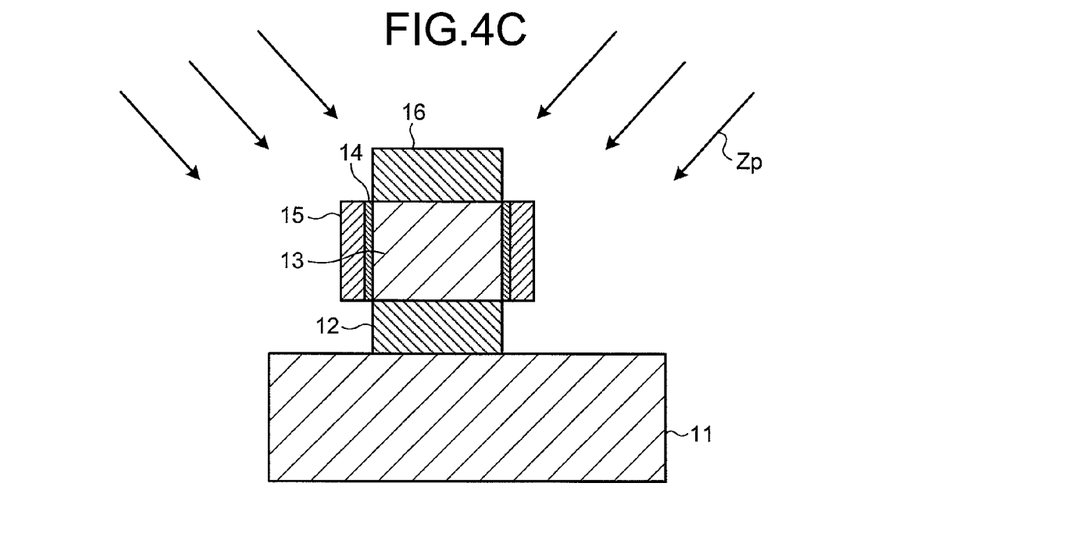

As shown in FIG. 4C, oblique ion implantation Zp of impurities to the pillar 11a is then performed by using the gate electrode 15 as a mask, thereby forming the impurity layer 12, the channel layer 13, and the impurity layer 16 in the pillar 11a.

Figure 4D:
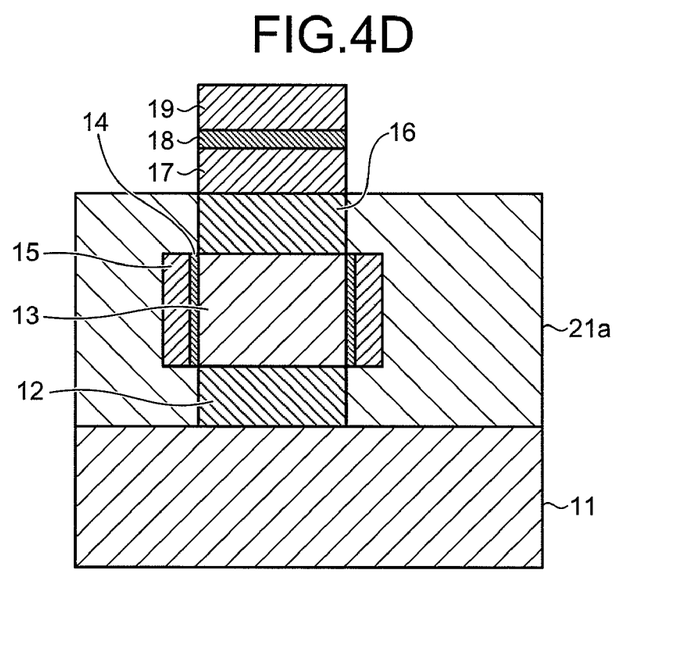

The insulating layer 21a is then formed on the semiconductor substrate 11 by using a method such as chemical vapor deposition (CVD) so that the selection transistor 31 is embedded therein as shown in FIG. 4D. The insulating layer 21a is planarized by using a method such as chemical mechanical polishing (CMP) or etching back, thereby exposing a surface of the impurity layer 16.

The magnetic layer 17, the nonmagnetic layer 18, and the magnetic layer 19 are successively deposited on the impurity layer 16 and the insulating layer 21a by using a method such as sputtering. The magnetic layer 17, the nonmagnetic layer 18, and the magnetic layer 19 are then dry etched by using a resist pattern formed by the photolithographic technique as a mask, thereby removing the magnetic layer 17, the nonmagnetic layer 18, and the magnetic layer 19 on the insulating layer 21a to form the spin-injection magnetization-reversal element 32 on the impurity layer 16.

Figure 4E:
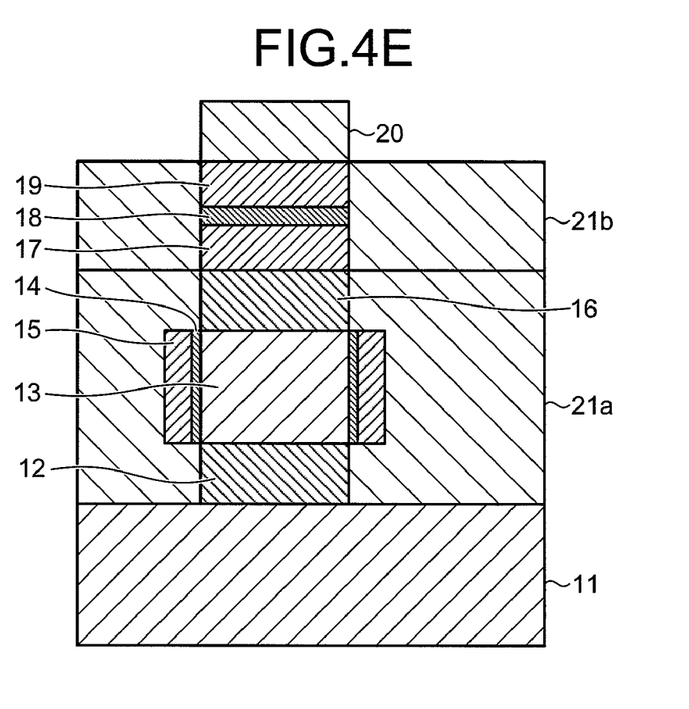

As shown in FIG. 4E, the insulating layer 21b is then formed on the insulating layer 21a by using a method such as CVD to embed the spin-injection magnetization-reversal element 32 therein. The insulating layer 21b is then planarized by using a method such as CMP or etching back to expose a surface of the magnetic layer 19.

A conductive layer is then deposited on the magnetic layer 19 and the insulating layer 21b by using a method such as sputtering. The conductive layer is dry etched by using a resist pattern formed by the photolithographic technique as a mask, thereby forming the bit line 20 on the magnetic layer 19 and the insulating layer 21b.

The insulating layer 21c is then formed on the insulating layer 21b by using a method such as CVD to embed the bit line 20 in the insulating layer 21c, as shown in FIG. 1A. The plug electrode 22 connected to the gate electrode 15 is embedded in the insulating layers 21a to 21c, and then the word line 23 connected to the plug electrode 22 is formed on the insulating layer 21c.

In the first embodiment, the configuration including the magnetic layer 17, the nonmagnetic layer 18, and the magnetic layer 19 has been explained as the spin-injection magnetization-reversal element 32. The spin-injection magnetization-reversal element 32 can have other configurations. For example, upper and lower electrodes can be placed on and underneath the spin-injection magnetization-reversal element 32. An antiferromagnetic layer can be provided to fix magnetization of the magnetic fixed layer. A double pin configuration can be used as well as a single pin configuration.

Configurations of the spin-injection magnetization-reversal element 32 other than that shown in FIG. 1A are explained in second and third embodiments of the present invention.

Figure 5A:
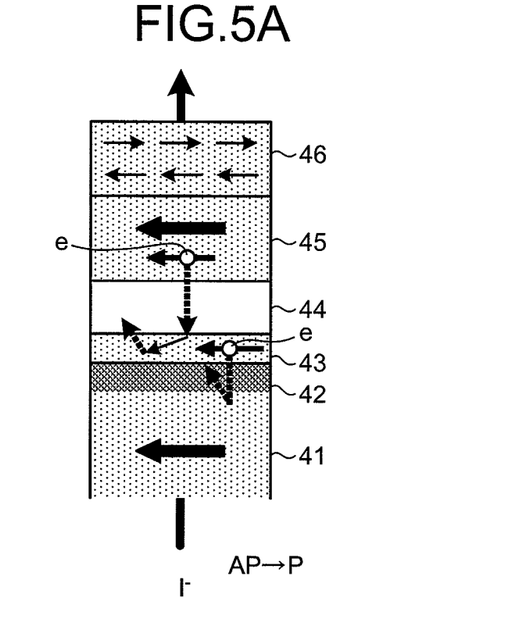
FIGS. 5A and 5B are cross-sectional views of a schematic configuration of a spin-injection magnetization-reversal element according to a second embodiment of the present invention.
Figure 5B:
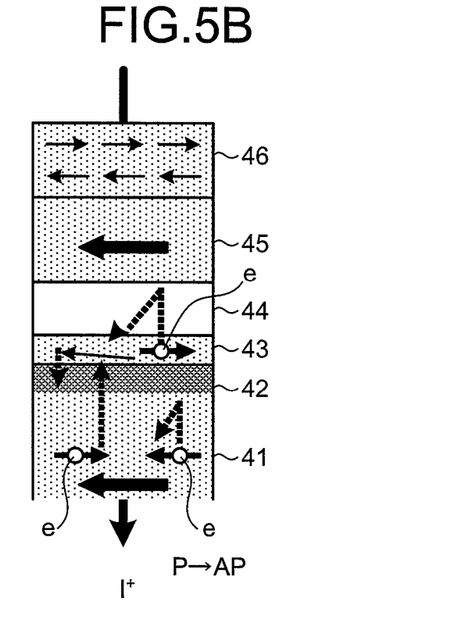

FIGS. 5A and 5B are cross-sectional views of a schematic configuration of a spin-injection magnetization-reversal element according to the second embodiment.

In FIGS. 5A and 5B, a spin filter layer 42, a magnetization free layer 43, a nonmagnetic layer 44, a magnetization fixed layer 45, and an antiferromagnetic layer 46 are successively deposited on a magnetization fixed layer 41. For example, it is possible to use CoFe as materials for the magnetization fixed layers 41 and 45 and the magnetization free layer 43, Ru as a material for the spin filter layer 42, Cu as a material for the nonmagnetic layer 44, and IrMn as a material for the antiferromagnetic layer 46.

When a current $I^-$ vertically flows through the magnetization fixed layer 41, the spin filter layer 42, the magnetization free layer 43, the nonmagnetic layer 44, the magnetization fixed layer 45, and the antiferromagnetic layer 46, electrons e having up spin are injected from the magnetization fixed layer 45 to the magnetization free layer 43, as shown in FIG. 5A. The electrons e having up spin and passed through the magnetization free layer 43 are then reflected on an interface between the magnetization fixed layer 41 and the spin filter layer 42, and returned to the magnetization free layer 43. As a result, upward torque is applied to the electrons in the magnetization free layer 43, which brings the direction of the magnetization of the magnetization free layer 43 parallel to that of the magnetization free layer 45. Accordingly, a logical value "0" is stored in the spin-injection magnetization-reversal element.

Meanwhile, when a current I+ vertically flows through the magnetization fixed layer 41, the spin filter layer 42, the magnetization free layer 43, the nonmagnetic layer 44, the magnetization fixed layer 45, and the antiferromagnetic layer 46, electrons e having down spin are injected from the magnetization fixed layer 45 to the magnetization free layer 43. The electrons e having down spin are reflected on an interface between the nonmagnetic layer 44 and the magnetization fixed layer 45, and returned to the magnetization free layer 43. As a result, downward torque is applied to the electrons in the magnetization free layer 43, which brings the direction of the magnetization of the magnetization free layer 43 antiparallel to that of the magnetization fixed layer 45. Accordingly, a logical value "1" is stored in the spin-injection magnetization-reversal element.

Because the spin filter layer 42 is placed between the magnetization fixed layer 41 and the magnetization free layer 43, a spin accumulation effect can be increased and a current density required for magnetization reversal can be reduced.

Figure 6:
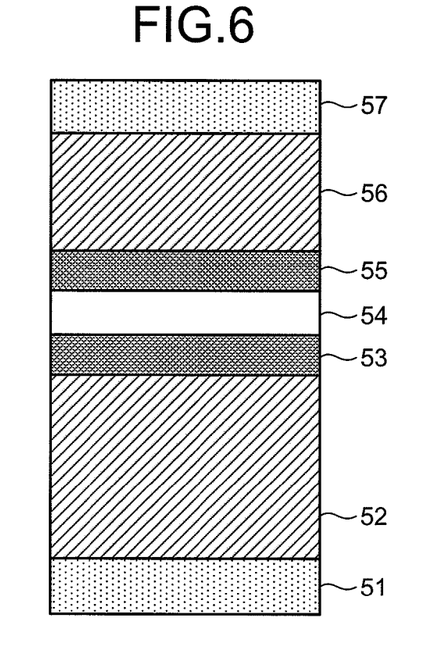
FIG. 6 is a cross-sectional view of a schematic configuration of a spin-injection magnetization-reversal element according to a third embodiment of the present invention.

FIG. 6 is a cross-sectional view of a schematic configuration of a spin-injection magnetization-reversal element according to the third embodiment.

In FIG. 6, a vertical-magnetization pinning layer 52, an interface magnetic layer 53, a tunnel film 54, an interface magnetic layer 55, and a vertical-magnetization free layer 56 are successively deposited on an electrode 51. It is possible to use CoFeB as materials for the interface magnetic layers 53 and 55, and MgO as a material for the tunnel film 54, for example.

When a vertical magnetic film is used for the magnetization fixed layer and the magnetization free layer in the spin-injection magnetization-reversal element, the spin-injection magnetization-reversal element can be brought less subject to a diamagnetic field as compared to an in-plane magnetization method. Accordingly, an energy level during the magnetization reversal can be lowered and a write current can be reduced.

Figure 7:
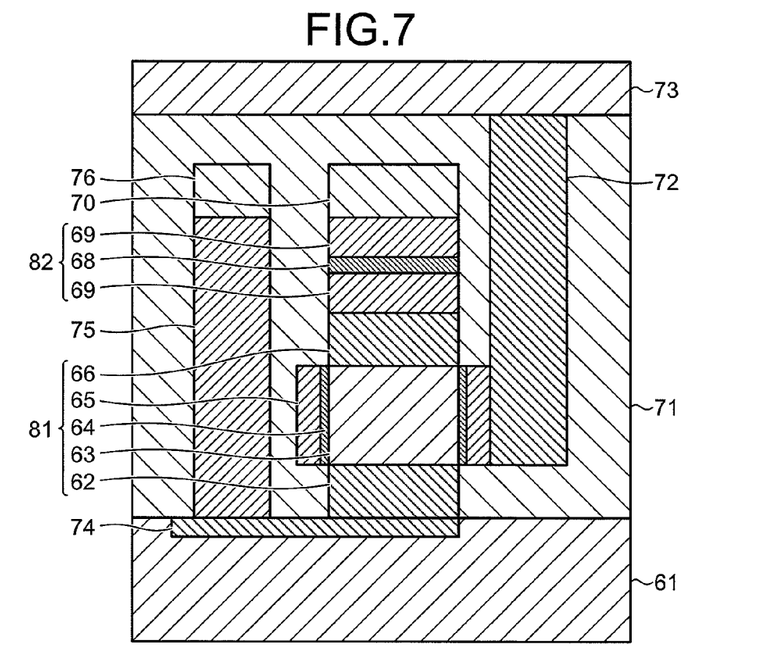
FIG. 7 is a cross-sectional view of a schematic configuration of a unit cell in a semiconductor memory device according to a fourth embodiment of the present invention.
Figure 8:
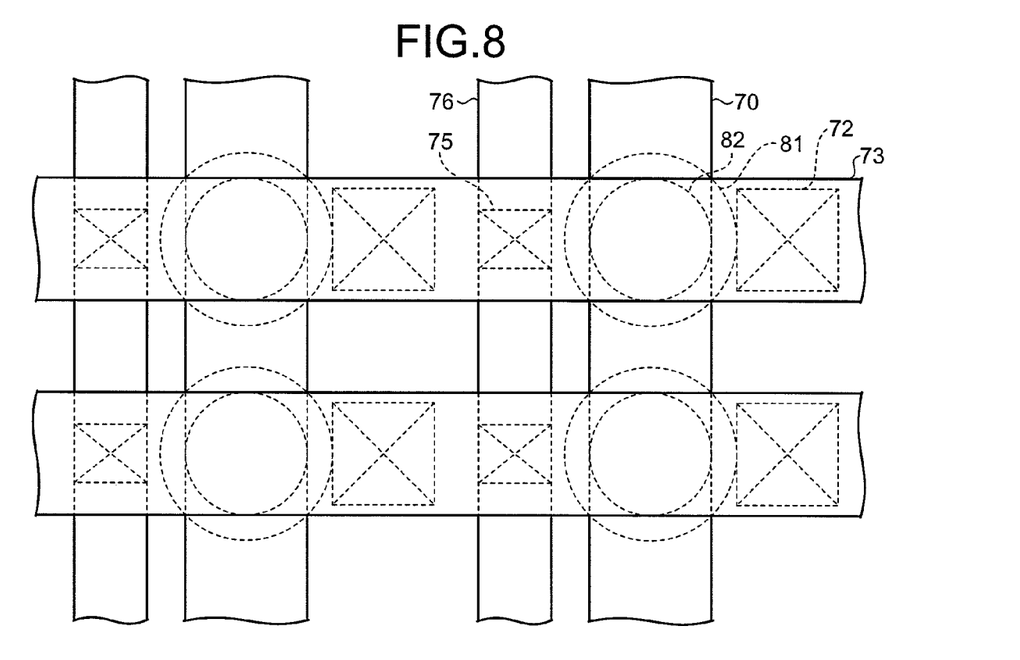
FIG. 8 is a plan view of a schematic configuration of the semiconductor memory device according to the fourth embodiment.

FIG. 7 is a cross-sectional view of a schematic configuration of a unit cell of a semiconductor memory device according to a fourth embodiment of the present invention. FIG. 8 is a plan view of a schematic configuration of the semiconductor memory device according to the fourth embodiment.

In FIGS. 7 and 8, an impurity layer 62, a channel layer 63, and an impurity layer 66 are successively deposited in the form of a pillar on a semiconductor substrate 61. A gate electrode 65 is placed to surround a circumference of the channel layer 63 with a gate insulating film 64 interposed therebetween, thereby forming a selection transistor 81. A magnetic layer 67, a nonmagnetic layer 68, and a magnetic layer 69 are successively deposited on the impurity layer 66, thereby forming a spin-injection magnetization-reversal element 82 on the selection transistor 81. A bit line 70 electrically connected to the magnetic layer 69 is formed on the spin-injection magnetization-reversal element 82 in the column direction, and a plate line 76 is formed in parallel to the bit line 70.

The selection transistor 81, the spin-injection magnetization-reversal element 82, the bit line 70, and the plate line 76 are embedded in an insulating layer 71. An impurity layer 74 connected to the impurity layer 62 is formed in the semiconductor substrate 61. The plate line 76 is connected to the impurity layer 74 via a plug electrode 75 embedded in the insulating layer 71. A word line 73 is formed on the insulating layer 71 in the row direction. The word line 73 is electrically connected to the gate electrode 65 via a plug electrode 72 embedded in the insulating layer 71.

Because the plate line 76 electrically connected to the impurity layer 62 is provided parallel to the bit line 70, the need to use the semiconductor substrate 61 as the plate line 76 can be eliminated, and thus a resistance of the plate line 76 can be reduced. Accordingly, a write current flowing through the unit cell can be uniformized.

Figure 9:
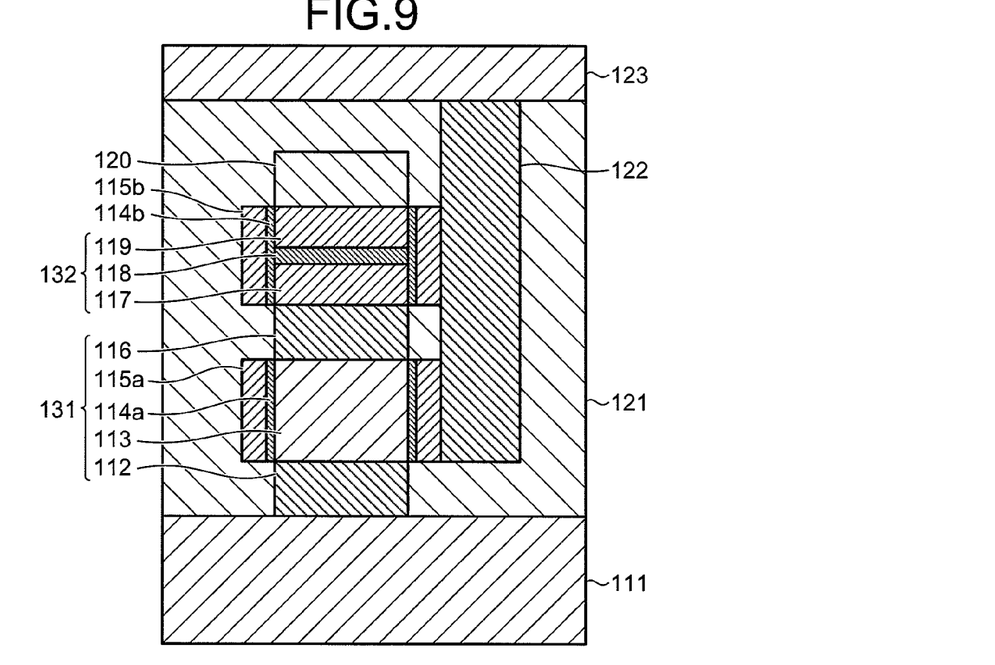
FIG. 9 is a cross-sectional view of a schematic configuration of a unit cell in a semiconductor memory device according to a fifth embodiment of the present invention.

FIG. 9 is a cross-sectional view of a schematic configuration of a unit cell of a semiconductor memory device according to a fifth embodiment of the present invention.

In FIG. 9, an impurity layer 112, a channel layer 113, and an impurity layer 116 are successively deposited in the form of a pillar on a semiconductor substrate 111. A gate electrode 115a is then placed to surround a circumference of the channel layer 113 with a gate insulating film 114a interposed therebetween. In this way, a selection transistor 131 is formed.

A magnetic layer 117, a nonmagnetic layer 118, and a magnetic layer 119 are successively deposited on the impurity layer 116, thereby forming a spin-injection magnetization-reversal element 132 on the selection transistor 131. The spin-injection magnetization-reversal element 132 has a magnetic shield layer 115b placed to surround circumferences of the magnetic layer 117, the nonmagnetic layer 118, and the magnetic layer 119 with an insulating layer 114b interposed therebetween.

A bit line 120 electrically connected to the magnetic layer 119 is formed on the spin-injection magnetization-reversal element 132 in the column direction. The selection transistor 131, the spin-injection magnetization-reversal element 132, and the bit line 120 are embedded in an insulating layer 121.

A word line 123 is formed on the insulating layer 121 in the row direction. The word line 123 is electrically connected to the gate electrode 115a via a plug electrode 122 embedded in the insulating layer 121. When a high density of impurities is introduced, the semiconductor substrate 111 can be used as a plate line.

Because the magnetic shield layer 115b is placed to surround the circumferences of the magnetic layer 117, the nonmagnetic layer 118, and the magnetic layer 119, a shielding effectiveness of flux generated by a current flowing through the spin-injection magnetization-reversal element 132 can be enhanced. Accordingly, the distance between memory cells can be reduced while the magnetic interference between the memory cells is suppressed. Therefore, the degree of integration in the MRAM can be increased without causing a malfunction.

Figure 10:
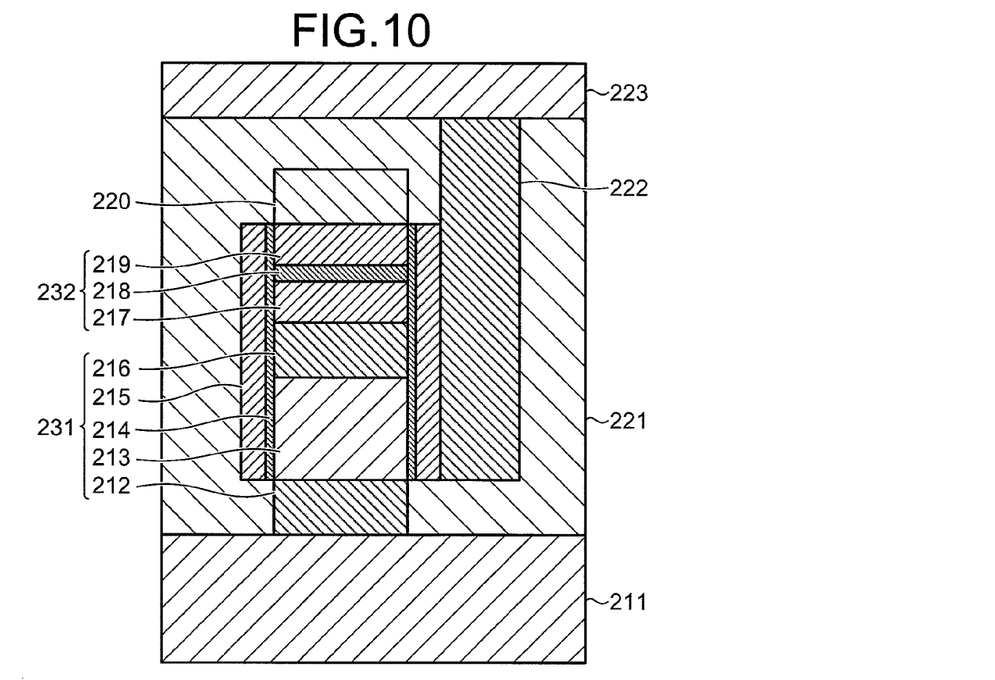
FIG. 10 is a cross-sectional view of a schematic configuration of a unit cell in a semiconductor memory device according to a sixth embodiment of the present invention.

FIG. 10 is a cross-sectional view of a schematic configuration of a unit cell of a semiconductor memory device according to a sixth embodiment of the present invention.

In FIG. 10, an impurity layer 212, a channel layer 213, and an impurity layer 216 are successively deposited in the form of a pillar on a semiconductor substrate 211. A gate electrode 215 is then placed to surround circumferences of the impurity layer 212, the channel layer 213, and the impurity layer 216 with a gate insulating film 214 interposed therebetween. In this way, a selection transistor 231 is formed.

A magnetic layer 217, a nonmagnetic layer 218, and a magnetic layer 219 are successively deposited on the impurity layer 216, thereby forming a spin-injection magnetization-reversal element 232 on the selection transistor 231. In the spin-injection magnetization-reversal element 232, the gate electrode 215 is arranged to surround circumferences of the magnetic layer 217, the nonmagnetic layer 218, and the magnetic layer 219 with the gate insulating film 214 interposed therebetween.

A bit line 220 electrically connected to the magnetic layer 219 is formed on the spin-injection magnetization-reversal element 232 in the column direction. The selection transistor 231, the spin-injection magnetization-reversal element 232, and the bit line 220 are embedded in an insulating layer 221.

A word line 223 is formed on the insulating layer 221 in the row direction. The word line 223 is electrically connected to the gate electrode 215 via a plug electrode 222 embedded in the insulating layer 221. When a high density of impurities is introduced, the semiconductor substrate 211 can be used as a plate line.

In the sixth embodiment, the gate electrode 215 is placed to surround the circumferences of the magnetic layer 217, the nonmagnetic layer 218, and the magnetic layer 219, as well as the circumferences of the impurity layer 212, the channel layer 213, and the impurity layer 216. In this way, the shielding effectiveness of the flux generated by a current flowing through the selection transistor 231 and the spin-injection magnetization-reversal element 232 can be increased. Accordingly, it is possible to reduce the distance between the memory cells while suppressing the magnetic interference between the memory cells. Therefore, the integration degree of the MRAM can be increased without causing a malfunction.

Figure 11A:
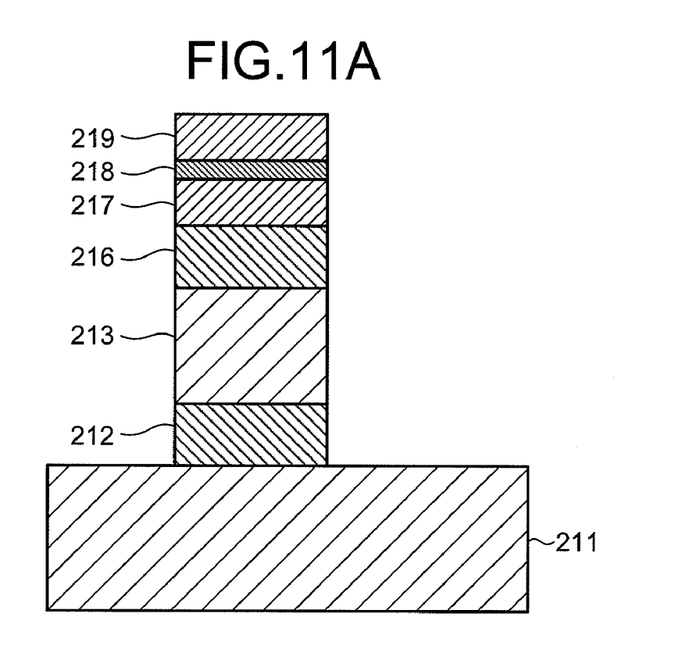
FIGS. 11A and 11B are cross-sectional views for explaining a manufacturing method for the semiconductor memory device shown in FIG. 10.
Figure 11B:
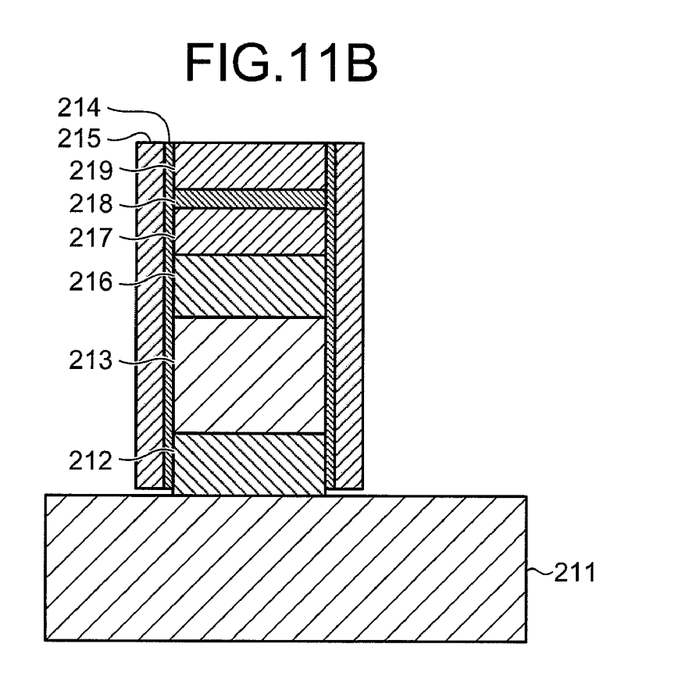

FIGS. 11A and 11B are cross-sectional view of a manufacturing method for the semiconductor memory device shown in FIG. 10.

In FIG. 11A, epitaxial growth is performed with impurities doped, thereby successively depositing the impurity layer 212, the channel layer 213, and the impurity layer 216 on the semiconductor substrate 211. The magnetic layer 217, the nonmagnetic layer 218, and the magnetic layer 219 are then successively deposited on the impurity layer 216 by using a method such as sputtering.

The impurity layer 212, the channel layer 213, the impurity layer 216, the magnetic layer 217, the nonmagnetic layer 218, and the magnetic layer 219 are then dry etched by using a resist pattern formed by the photolithographic technique as a mask. In this way, the impurity layer 212, the channel layer 213, the impurity layer 216, the magnetic layer 217, the nonmagnetic layer 218, and the magnetic layer 219 are patterned in the form of a pillar.

Next, as shown in FIG. 11B, the gate insulating film 214 is formed on side walls of the impurity layer 212, the channel layer 213, the impurity layer 216, the magnetic layer 217, the nonmagnetic layer 218, and the magnetic layer 219 in the form of a pillar by using a method such as thermal oxidation or CVD. The gate electrode 215 is then formed on the gate insulating film 214 to surround the circumferences of the impurity layer 212, the channel layer 213, the impurity layer 216, the magnetic layer 217, the nonmagnetic layer 218, and the magnetic layer 219 in the form of a pillar.

The bit line 220 is then formed on the spin-injection magnetization-reversal element 232 as shown in FIG. 10. Further, the insulating layer 221 that embeds therein the selection transistor 231, the spin-injection magnetization-reversal element 232, and the bit line 220 is formed on the semiconductor substrate 211. After the plug electrode 222 connected to the gate electrode 215 is embedded in the insulating layer 221, the word line 223 connected to the plug electrode 222 is formed on the insulating layer 221.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a channel layer on a first impurity layer;
   a second impurity layer on the channel layer;
   a gate electrode around a circumference of the channel layer with a gate insulating film between the channel layer and the gate electrode;
   a spin-injection magnetization-reversal element on the second impurity layer;
   a bit line on the spin-injection magnetization-reversal element;
   a word line on the bit line configured to electrically connect to the gate electrode; and
   a magnetic shield layer around a circumference of the spin-injection magnetization-reversal element, the magnetic shield layer formed by extending the gate electrode around the circumference of the spin-injection magnetization-reversal element.

2. The semiconductor memory device of claim 1, further comprising a plate line in parallel to the bit line configured to electrically connect to the first impurity layer.

3. The semiconductor memory device of claim 2, further comprising:
   a semiconductor substrate underneath the first impurity layer;
   a third impurity layer in the semiconductor substrate configured to connect to the first impurity layer; and
   a plug electrode connecting the third impurity layer and the plate line.

4. The semiconductor memory device of claim 1, wherein the first impurity layer, the channel layer, the second impurity layer, and the spin-injection magnetization-reversal element comprise column shapes.

5. The semiconductor memory device of claim 4, further comprising a plug electrode next to the gate electrode, configured to connect the gate electrode and the word line.

6. The semiconductor memory device of claim 5, wherein a diameter of the gate electrode is larger than a width of the bit line.

7. The semiconductor memory device of claim 1, wherein the spin-injection magnetization-reversal element comprises:
   a first magnetization fixed layer;
   a spin filter layer on the first magnetization fixed layer;
   a magnetization free layer on the spin filter layer;
   a nonmagnetic layer on the magnetization free layer;
   a second magnetization fixed layer on the nonmagnetic layer; and
   an antiferromagnetic layer on the second magnetization fixed layer.

8. The semiconductor memory device of claim 7, wherein the first magnetization fixed layer, the second magnetization fixed layer, and the magnetization free layer comprise cobalt ferrite (CoFe), the spin filter layer is ruthenium (Ru), the nonmagnetic layer is copper (Cu), and the antiferromagnetic layer comprises iridium manganese (IrMn).

9. A semiconductor memory device comprising:
a channel layer on a first impurity layer;
a second impurity layer on the channel layer;
a gate electrode around a circumference of the channel layer with a gate insulating film between the channel layer and the gate electrode;
a spin-injection magnetization-reversal element on the second impurity layer, the spin-injection magnetization-reversal element comprising:
a vertical-magnetization pinning layer,
a first interface magnetic layer on the vertical-magnetization pinning layer,
a tunnel film on the first interface magnetic layer,
a second interface magnetic layer on the tunnel film, and
a vertical-magnetization free layer on the second interface magnetic layer;
a bit line on the spin-injection magnetization-reversal element; and
a word line on the bit line configured to electrically connect to the gate electrode.

10. The semiconductor memory device of claim 9, wherein the first and second interface magnetic layers comprise cobalt ferrite boride (CoFeB), and the tunnel film comprises magnesium-oxide (MgO).

* * * * *